United States Patent [19]
Daugherty

[11] Patent Number: 5,189,421
[45] Date of Patent: Feb. 23, 1993

[54] MICROCONTROLLER BASED ANALOG-TO-DIGITAL CONVERTER USING VARIABLE PULSE WIDTH MODULATION

[75] Inventor: Kevin M. Daugherty, Brighton, Mich.

[73] Assignee: National Semiconductor Corporation, Santa Clara, Calif.

[21] Appl. No.: 813,205

[22] Filed: Dec. 23, 1991

[51] Int. Cl.$^5$ ............................................. H03M 1/60
[52] U.S. Cl. ..................................... 341/157; 341/164
[58] Field of Search ............... 341/155, 157, 164, 165, 341/172, 133

[56] References Cited
U.S. PATENT DOCUMENTS
5,063,383 11/1991 Bobba .................................. 341/120

Primary Examiner—Marc Hoff
Attorney, Agent, or Firm—Flehr, Hohbach, Test, Albritton & Herbert

[57] ABSTRACT

A microcontroller based analog-to-digital converter is disclosed. The microcontroller is coupled to an output of a comparator. The comparator includes an input for receiving an unknown analog voltage and an input coupled to a capacitor. The capacitor is also coupled to the microcontroller through a resistor. Based upon the output of the comparator, the microcontroller provides a pulsed input signal with a predetermined duty cycle to the capacitor. The duty cycles for "high" pulses and "low" pulses are individually set to match a selected input voltage range. The rate at which pulses are applied to the capacitor is adjusted until the voltage on the capacitor matches the input voltage being measured. The pulsed input signal is monitored to establish a pulse count. Based upon the pulse count, the unknown analog voltage value is converted to a corresponding digital voltage value.

12 Claims, 5 Drawing Sheets

MICROCONTROLLER BASED ANALOG-TO-DIGITAL CONVERTER USING VARIABLE PULSE WIDTH MODULATION

BRIEF DESCRIPTION OF THE INVENTION

The present invention generally relates to analog-to-digital converters. More particularly, the present invention relates to a low cost microcontroller based analog-to-digital converter which utilizes variable range pulse width modulation.

BACKGROUND OF THE INVENTION

Dedicated analog-to-digital (A/D) converters are known in the art. These converters offer high speed and resolution, but they are relatively expensive. Many A/D applications do not require high speed or resolution. For instance, many automotive applications such as potentiometer settings for light-dimmers, fuel-level indicators, signal converters for temperature and pressure sensors, and battery-voltage indicators do not experience rapid voltage variations with time, nor do they require high resolution voltage readings. Thus, for these applications and many others, low cost A/D converters have been proposed.

It is known in the art to use a high speed CMOS microcontroller to achieve an eight bit A/D conversion in approximately 10 ms. This technique is based on the fact that if a repetitive waveform is applied to an RC network, the capacitor will charge to the average voltage, provided that the RC time constant of the RC network is much larger than the pulse widths in the repetitive waveform. The rate at which pulses are applied to the capacitor is adjusted until the voltage on the capacitor matches the input voltage being measured. The basic equation for computing the A/D result is:

$$Vin = Vref[Ton/(Ton + Toff)] \quad (1)$$

Where Ton and Toff are the amount of time the waveform is at its high and low voltages, respectively.

To achieve the desired resolution with this approach, it is necessary to precisely measure several Ton and Toff time periods. In addition, the waveform must be gradually adjusted to allow for the large RC time constant to settle out. This results in a relatively long conversion cycle. Better results are obtained by averaging several pulses over a fixed period of time and using the following equation:

$$Vin = Vref[Sum\ of\ Ton/(Sum\ of\ (Ton + Toff)] \quad (2)$$

FIG. 1 depicts a microcontroller based A/D converter 10. The A/D converter 10 utilizes a National Semiconductor COP822C microcontroller 12, a low cost LM2901 comparator 14, 2 100K resistors 16, and a 0.01 microfarads film capacitor 18. The microcontroller 12 provides a squarewave signal 20. The squarewave signal 20 includes an "off" pulse 21 with a logic level very close to ground and an "on" pulse 23 with a logic level very close to Vref. The signal generates a small ramp voltage on the capacitor for the inverting input of the comparator 14.

To minimize error, a tradeoff is made when selecting the resistors 16. The microcontroller output 22 should have a large resistor 16A to minimize the output switching offset, and the comparator should have a small resistor 16B due to error caused by input bias offset current. In this embodiment, a 100 k resistor 16A is used in the RC network for one comparator 14 input. Therefore, another 100 k resistor 16B is required for the Vin input to balance the offset voltage caused by the comparator input bias current.

Once the resistor sizes are determined, the capacitor 18 should be chosen so that the RC time constant is large enough to provide a small incremental voltage ramp. This design has a sample time of 20 microseconds and has a 1 millisecond RC time constant with a 0.01 mfd film capacitor 18 which has low leakage current to prevent errors.

Turning to FIG. 2, a prior art approach to programming the microcontroller 12 of FIG. 1 is depicted. By way of overview, 768 ("on" or "off") pulses are applied by the microcontroller 12 to the comparator 14 through capacitor 18. A third of the pulses (256) are used to charge the capacitor 18 so that it is approximately equal with Vin. Thereafter, a positive pulse is applied by microcontroller 12 to capacitor 18 when Vc drops below Vin. This equalizing of the voltage on the capacitor, Vc, with the input voltage, Vin, continues for the remaining number of pulses. After the remaining pulses have been applied, equation 2 is used to calculate Vin.

More specifically, the prior art approach works as follows. A program is stored within the memory of microcontroller 12. This program corresponds to the instruction set of FIG. 2. First, the total number of pulse counts, for instance 768, is loaded, and the same value is assigned to the variable Ton, which designates the number of "on" pulses applied by the microcontroller 12 (block 30). Next, the output from the comparator 14 is sampled (block 32). If the output from the comparator 14 is ZERO, then the voltage on the capacitor, Vc, is larger than the input voltage, Vin. To equalize the voltages, a negative pulse ("off" pulse) is applied by the microcontroller (block 34). In addition, the Ton value is decremented by one; that is, the Ton value was loaded assuming all pulses would be positive; therefore, the Ton value must be decremented. The period for both "on" and "off" pulses is equivalent.

If the output from the comparator 14 is ONE, then the voltage on the capacitor, Vc, is smaller than the input voltage, Vin. To equalize the voltages, a positive pulse is applied by the microcontroller (block 38). In this instance, a delay is applied by the microcontroller (block 40) in order to equalize the time with the opposite loop (blocks 34 and 36).

Thereafter, the counter is decremented (block 42) to indicate that another pulse has been processed. If the total number of pulses has been reduced to 512 (decision block 44), then the capacitor is initialized; that is, one third of the pulses have been applied and the capacitor is roughly set to Vin. At this juncture, Ton is reset to 512 to indicate the remaining loops or pulse counts to be processed (block 46).

If the total number of pulses does not equal 512 (decision block 44), then a determination is made as to whether the total count of pulses is equal to zero (decision block 48). If the total count has not been reduced to zero, then the pulse processing continues until a total of 768 pulses have been processed. Once all pulses have been processed, the value of Ton is used in equation (2) to calculate Vin (block 50). Thus, in the example provided, the value of Ton will be divided by 512 and multiplied by Vref to determine Vin. Alternately, the eight bit value obtained by dividing Ton by two represents the input voltage, in binary form.

While this prior art solution provides an efficient and inexpensive A/D conversion, there are still a number of problems associated with it. First, the accuracy of the conversion may be improved. Next, the comparator 14 generally requires a 2 volt supply voltage above its input range. Thus, with a 5 volt supply, the actual input range of the comparator 14 is only 3 volts.

OBJECTS AND SUMMARY OF THE INVENTION

Thus, it is a general object of the present invention to provide an improved pulse width modulated A/D converter.

It is a related object of the present invention to provide a microcontroller based A/D converter with improved accuracy.

It is another object of the present invention to provide a microcontroller based A/D converter with an output range that matches its dynamic range.

These and other objects are achieved by a microcontroller based analog-to-digital converter. The microcontroller is coupled to an output of a comparator. The comparator includes an input for receiving an unknown analog voltage and an input coupled to a capacitor. The capacitor is also coupled to the microcontroller through a resistor. Based upon the output of the comparator, the microcontroller provides a pulsed input signal with a predetermined duty cycle to the capacitor. The duty cycles for high pulses and low pulses are individually set to match a selected input voltage range. The rate at which pulses are applied to the capacitor is adjusted until the voltage on the capacitor matches the input voltage being measured. The pulsed input signal is monitored to establish a pulse count. Based upon the pulse count, the unknown analog voltage value is converted to a corresponding digital voltage value.

BRIEF DESCRIPTION OF THE DRAWINGS

For a better understanding of the nature and objects of the invention, reference should be had to the following detailed description taken in conjunction with the accompanying drawings, in which.

Like reference numerals refer to corresponding parts throughout the several views of the drawings.

DETAILED DESCRIPTION OF THE INVENTION

Figure 1:
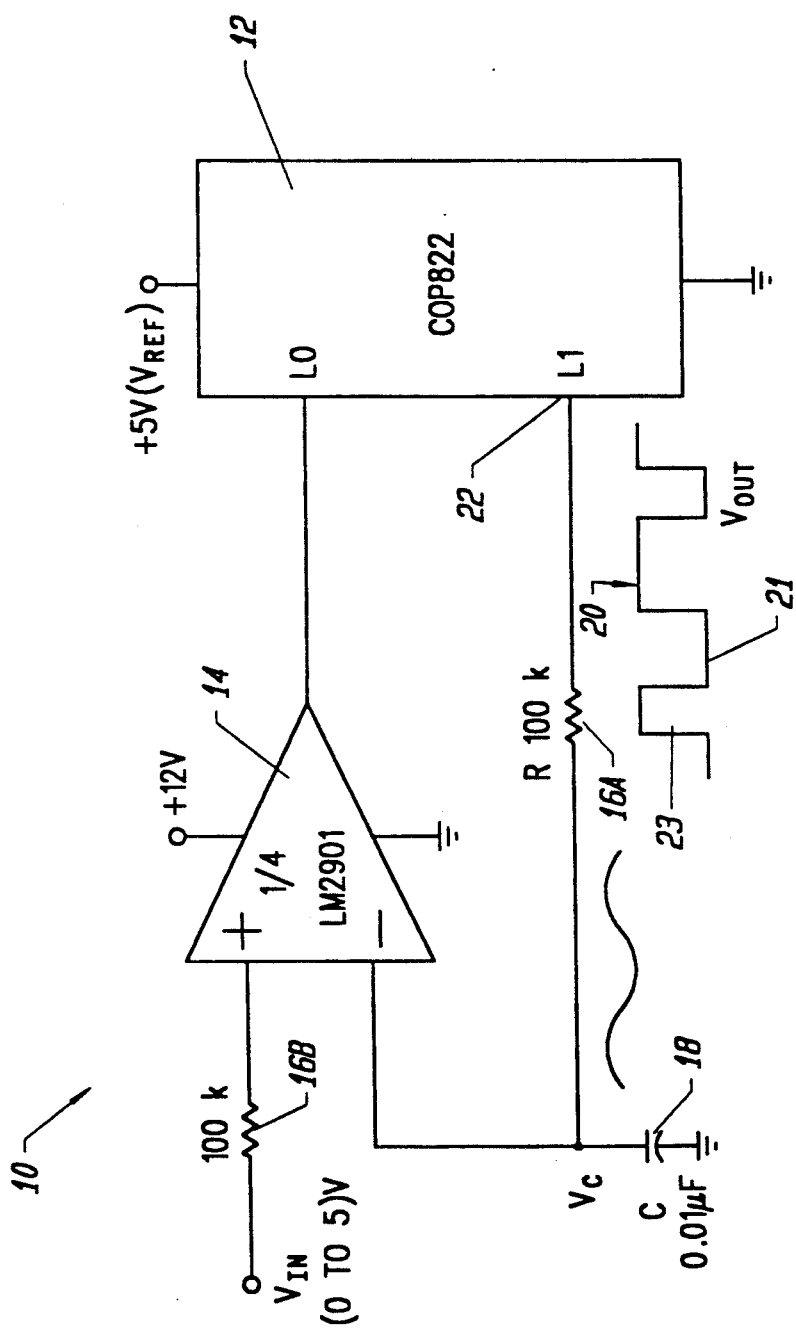
FIG. 1 is a microcontroller based A/D converter which may be used in accordance with the present invention.
Figure 2:
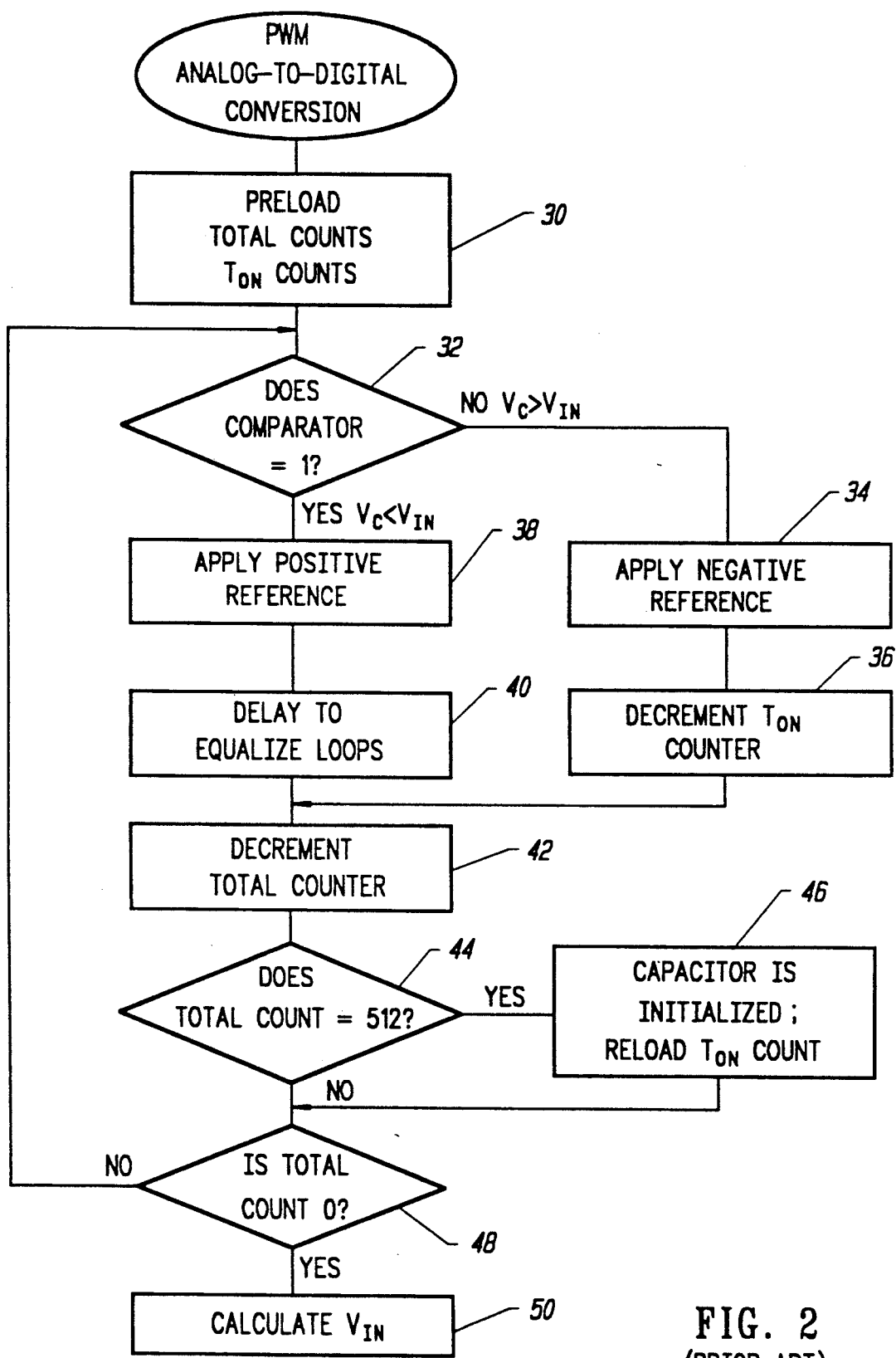
FIG. 2 is a flow chart depicting a prior art approach for a microcontroller based A/D converter.
Figure 3:
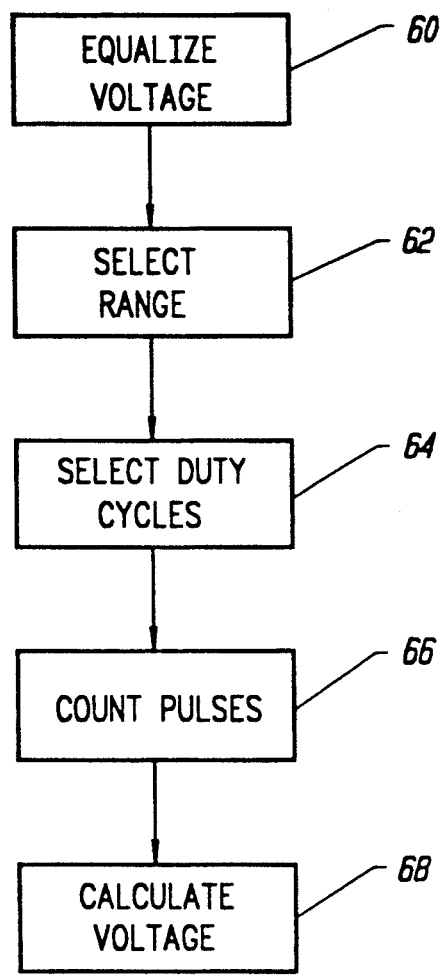
FIG. 3 is a generalized flow chart depicting the microcontroller based A/D converter of the present invention.

Referring to FIG. 3, a generalized flow chart is provided which depicts the microcontroller based A/D converter of the present invention. Initially, the input voltage Vin is equalized with the capacitor voltage Vc (block 60). Thereafter, a voltage range is selected (block 62) corresponding to a general estimate of the input voltage. This voltage range is used to select duty cycles for the pulses (block 64). In other words, instead of full duration pulses, pulses with a duty cycle are employed.

Thereafter, the "on" and "off" duty cycle pulses are counted (block 66). After all pulses are counted, the number of "on" pulses is used to calculate the input voltage (block 68).

Thus, with the present invention a range estimate of the input voltage is made. Based upon this range estimate, a duty cycle for the pulses is selected. The pulses with a duty cycle provide greater precision in equalizing the input capacitor, Vc, with the input voltage, Vin. Thus, a more accurate A/D conversion is possible in the same amount of time.

The present invention also results in greater precision by basing its A/D conversion on the actual input range of the comparator for a given supply voltage. In other words, the useful voltage range of the A/D converter is used in determining the A/D conversion. For instance, for a 5 volt supply, a 2 volt drop from the supply voltage will result in an actual input voltage range of 0 to 3 volts. The duty cycles of the pulses used may be adjusted to reflect this information. Thus, the duty cycle for a high input pulse will not be 100%, but 60% (3/5 volts), corresponding to the actual input range.

Figure 4:
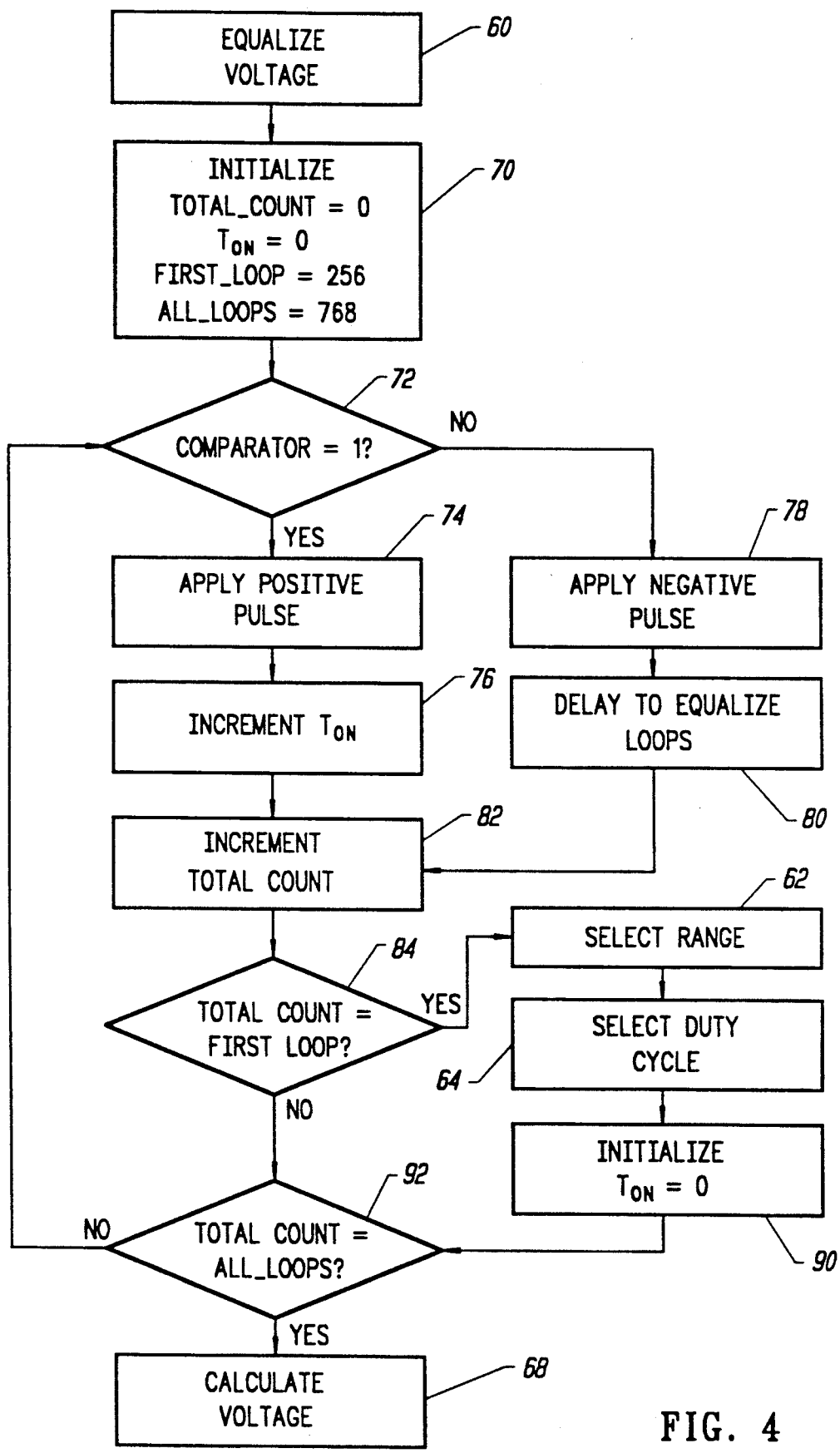
FIG. 4 is a more detailed flow chart of the A/D converter of FIG. 3.

A more detailed disclosure of the present invention is provided in conjunction with FIG. 4. The first step associated with the present invention is to equalize the capacitor voltage with the input voltage (block 60). This may be accomplished in a number of ways. The approach described in relation to the prior art may be employed. Alternately, one may apply high pulses until the comparator equals 1, indicating that Vc is charged and actually exceeds Vin.

The next step is to initialize values (block 70). In particular, the value corresponding to the total number of pulses counted (Total_Count) is set to zero, and the total count of "on" pulses (Ton) is set to zero. In addition, values for First_Loop and All_Loops are loaded. For instance, First_Loop may be set to 256, corresponding to an 8-bit count which will be sufficient to balance the input capacitor voltage, Vc, with the input voltage, Vin. All_Loops may be set to 768, equivalent to three cycles of the 8-bit counter. The remaining counts are used in applying the duty cycle pulses.

The next step is to sample the comparator (block 72). If the comparator output is ONE, a positive pulse is applied (block 74). The positive pulse is counted (block 76). If the comparator output is ZERO, a negative pulse (an "off" pulse) is applied (block 78) to reduce the voltage on the capacitor 18. In the case of a negative pulse, a delay is utilized (block 80) to equalize the loops.

The next step, regardless of the comparator value, is to increment the Total_Count value by ONE (block 82). Thereafter, the Total_Count value is compared to determine whether the first loop of 256 pulses is completed. If this value has not been reached, then the Total_Count will be less than All_Loops (block 92), and the process is repeated. When the first loop of 256 pulses is completed, the voltage on the capacitor, Vc, is balanced with the input voltage Vin.

At this juncture, the prior art reinitializes values and begins counting pulses once again. In contrast, the present invention uses this initial voltage value to select pulses with duty cycles which will provide a more accurate A/D conversion.

In particular, an estimate of the input voltage, Vin, is used to select a voltage range (block 62) VL to VH. Thus, the Ton value is used in accordance with equation (2) to estimate Vin. From this value, a range is selected which will determine the duty cycles. For instance, a 5 volt range may be divided into four subranges (VL to VH equal): 0–1.25, 1.25–2.5, 2.5–3.75, and 3.75 to 5.0. Note that the four subranges may correspond to a two bit value. For instance, the two bit binary value of "00" would correspond to the subrange 0–1.25, while the two bit binary value "10" would correspond to the subrange 2.5–3.75. In any event, if the Vin estimate is 2 volts, then this value falls into the second subrange of 1.25–2.5. The extreme values of this range may be used to select a duty cycle (block 64). That is, the low duty cycle will be equivalent to the low voltage value VL of the subrange divided by the total input voltage range, or 1.25/5, which is equivalent to a 25% duty cycle. The high duty cycle will be equivalent to the high voltage value VH of the subrange divided by the total input voltage range, or 2.5/5, which is equivalent to a duty cycle of approximately 50%.

After the duty cycles are selected, the Ton value is initialized to ZERO (block 90). Then, the Total_Count value is compared to the All_Loops value (block 92). At this point, Total_Count will be 512 less than All_Loops, and therefore the pulse applying loop (blocks 72 through 82) will be re-entered. However, for the remaining pulses, the duty cycle values will be used. That is, instead of applying a full "on" or "off" value for the entire duration of the pulse, the microcontroller 12 divides the pulse into its duty cycle. Using the example provided above, an "on" pulse would correspond to the high duty cycle in which 50% of the duration of the pulse would be high while the remaining 50% would be low. The "off" pulse would correspond to the low duty cycle in which 25% of the duration of the pulse would be high while the remaining 75% would be low. Thus, the pulse applied to the input capacitor provides a closer estimate of the input voltage. This allows the voltage on the capacitor, Vc, to stay closer to the input voltage, Vin.

Thus, with the present invention, duty cycle pulses are applied at blocks 74 and 78, instead of the full cycle pulses used in the prior art. The duty cycle pulses are applied and the count of Ton pulses is tallied (block 76). After the designated number of loops is completed, the Total_Count value will be equivalent to the All_Loops value (block 92). Thereafter, the input voltage is calculated in accordance with the following equation:

$$Vin = VL + (VH - Vl)(\text{count of ON pulses/count of ON and OFF pulses}).$$

Alternately, the eight bit value obtained by dividing Ton by two represents the input voltage in the selected subrange.

Figure 5:
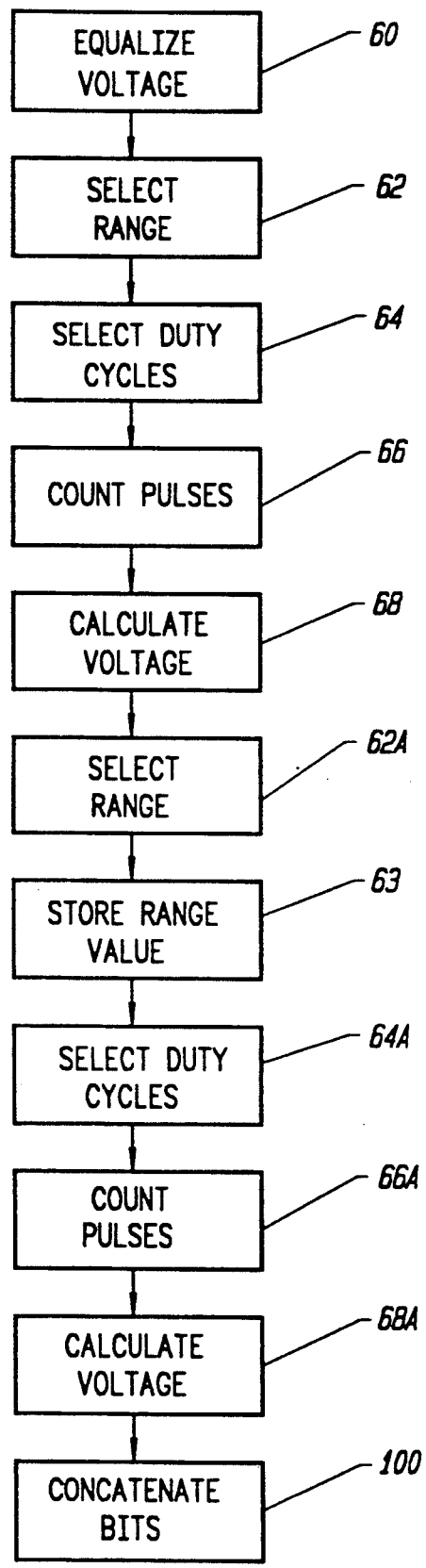
FIG. 5 is an alternate embodiment of the present invention.

Another embodiment of the present invention is provided in relation to FIG. 5. The embodiment of FIG. 5 provides improved resolution. Initially, the steps of the invention corresponding to FIG. 3 are performed (steps 60–68). The resultant voltage value is associated with a binary value (block 63). For instance, still relying upon the previous example, if the resultant voltage is 2 volts, then this value is within a subrange between 1.25 volts and 2.5 volts, which in turn corresponds to a two bit binary value of "01". The two bit binary value is stored. The steps of the invention corresponding to FIG. 3 are performed again (steps 62A–68A), rendering an 8 bit value. This 8 bit value is then concatenated with the initial two bit value (block 100). This provides a ten bit estimation of the voltage for the full input voltage range.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An apparatus for converting an analog voltage value to a digital voltage value, said apparatus comprising:

a comaprator to comapre an unknown analog voltage value with a voltage value on a capacitor and generating a corresponding comparator output signal;

means for monitoring said comparator output signal to provide pulsed signals to said capacitor, each of said pulsed signals having a dynamically defined duty cycle to maintain said voltage value on said capacitor approximately equal to said unknown analog voltage;

means for counting said pulsed signals to form a pulse count; and means for calculating said digital voltage value from said pulse count.

2. The apparatus of claim 1 wherein said pulsed signals include OFF pulses having a first dynamically defined duty cycle and ON pulses having a distinct second dynamically defined duty cycle;

said calculating means including means for calculating said digital voltage value in accordance with the equation:

$$Vin = Vref(VH - Vl)(\text{count of ON pulses/count of ON and OFF pulses})$$

where Vref is a reference voltage and Vin is said digital voltage value.

3. The apparatus of claim 1 wherein said pulsed signals include OFF pulses having a first dynamically defined duty cycle and ON pulses having a distinct second dynamically defined duty cycle; wherein said first and second dynamically efined duty cycles correspond to low and high voltages, VL and VH;

said calculating means including means for calculating said digital voltage value in accordance with the equation:

$$Vin = VL + (VH - Vl)(\text{count of ON pulses/count of ON and OFF pulses})$$

where Vin is said digital voltage value.

4. In a microcontroller based analog-to-digital converter, said microcontroller being coupled to an output of a comparator, said comparator including an input for receiving an unknown analog voltage and an input coupled to a capacitor, said capacitor being coupled to said microcontroller through a resistor, said microcontroller providing pulsed signals to said capacitor, the improvement comprising:

means for generating said pulsed signals with a dynamically defined duty cycle;

means for counting said pulsed signals to establish a pulse count; and means for determining said unknown voltage from said pulse count.

5. The apparatus of claim 4 wherein said pulsed signals include OFF pulses having a first dynamically defined duty cycle and ON pusles having a distinct second dynamically defined duty cycle; whereins aid first and second dynamically defined duty cycles correspond to low and high voltages, VL and VH;

said determining means including means for calculating said digital voltage value in accordance with the equation:

Vin=VL+(VH−VL)(count of ON pulses/count of ON and OFF pulses)

where Vin is said digital voltage value.

6. An analog-to-digital converter, comprising:

a microcontroller, said microcontroller including means for storing an instruction set and means for producing pulses;

a comparator, said comparator including a first input, a second input, and an output, said first input coupled to an unknown analog voltage input, and said output coupled to said microcontroller;

a capacitor, said capacitor coupled to said second input, and to said microcontroller through a resistor, said capacitor receiving said pulses from said producing means;

means for roughly equalizing the voltage on said capacitor with said unknown input voltage, said equalizing means utilizing said producing means, whereby said pulses are applied tos aid capacitor;

means for selecting a voltage subrange corresponding to said analog voltage input;

means for determining duty cycle pulses for said producing means, said determining means being responsive to said selecting means;

means for counting said duty cycle pulses applied to said capacitor; and means, responsive to said counting means, for digitally defining said analog voltage input value.

7. The apparatus of claim 6 wherein said pulses include OFF pulses having a first dynamically defined duty cycle and ON pulses having a distinct second dynamically defined duty cycle; wherein said first and second dynamically defined duty cycles correspond to low and high voltages, VL and VH;

said determining means including means for calculating said digital voltage value in accordance with the equation:

Vin=VL+(VH−VL)(count of ON pulses/count of ON and OFF pulses)

where Vin is said digital voltage value.

8. A method of converting an analog voltage value to a digital voltage value, said method comprising the steps of:

utilizing a comparator to compare an unknown analog voltage value with a voltage value on a capacitor and generating a corresponding comparator output signal;

monitoring said comparator output signal to provide pulsed signals to said capacitor, each of said pulsed signals having a dynamically defined duty cycle to maintain said voltage value on said capacitor approximately equal to said unknown analog voltage;

counting said pulsed signals to form a pulse count; and calculating said digital voltage value from said pulse count.

9. The method of claim 8 wherein said pulsed signals include OFF pulses having a first dynamically defined duty cycle and ON pulses having a distinct second dynamically defined duty cycle;

said calculating step including calculating said digital voltage value in accordance with the equation:

Vin=Vref+(count of ON pulses/count of ON and OFF pulses)

where Vref is a reference voltage and Vin is said digital voltage value.

10. The method of claim 8 wherein said pulsed signals include OFF pulses having a first dynamically defined duty cycle and ON pulses having a distinct second dynamically defined duty cycle; wherein said first and second dynamically defined duty cycles correspond to low and high voltages, VL and VH;

said calculating step including calculating said digital voltage value in accordance with the equation:

Vin=VL+(VH−VL)(count of ON pulses/count of ON and OFF pulses)

where Vin is said digital voltage value.

11. A method of utilizing a microcontroller, a comparator, a resistor, and a capacitor to convert an analog voltage value to a digital voltage value, said comparator including a first input, a second input, and an output, said first input being coupled to an unknown analog voltage value, said output being coupled to said microcontroller, said microcontroller applying a pulse signal to said resistor and said capacitor, said capacitor being coupled to said second input of said comparator, said method comprising the steps of:

(A) equalizing said analog voltage value with the voltage on said capacitor by applying said pulse signal to said resistor and said capacitor;

(B) selecting a voltage subrange corresponding to said analog voltage value;

(C) defining duty cycles for said pulse signal;

(D) counting said pulse signal applied to said resistor and said capacitor;

(E) calculating a digital voltage value corresponding to said analog voltage value;

(F) storing a multibit representation of said digital voltage value;

(G) repeating steps (C) through (E);

(H) concatenating said multibit representation of said digital voltage value with the recalculated digital voltage value.

12. The method of claim 11 wherein said pulsed signals include OFF pulses having a first dynamically defined duty cycle and ON pulses having a distinct second dynamically defined duty cycle; wherein said first and second dynamically defined duty cycles correspond to low and high voltages, VL and VH;

said calculating step including calculating said digital voltage value in accordance with the equation:

Vin=VL+(VH−VL)(count of ON pulses/count of ON and OFF pulses)

where Vin is said digital voltage value.

* * * * *